(12) United States Patent
Takei et al.

(10) Patent No.: US 11,414,747 B2
(45) Date of Patent: Aug. 16, 2022

(54) SPUTTERING DEVICE

(71) Applicant: Tokyo Electron Limited, Tokyo (JP)

(72) Inventors: Junichi Takei, Yamanashi (JP); Hiroshi Sone, Tokyo (JP); Naoyuki Suzuki, Tokyo (JP); Shinji Orimoto, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 76 days.

(21) Appl. No.: 16/446,441

(22) Filed: Jun. 19, 2019

(65) Prior Publication Data
US 2019/0390325 A1      Dec. 26, 2019

(30) Foreign Application Priority Data

Jun. 26, 2018 (JP) ................................. 2018-120503
Sep. 6, 2018 (JP) ................................. 2018-167204

(51) Int. Cl.
*H01J 37/34* (2006.01)
*C23C 14/35* (2006.01)
*C23C 14/54* (2006.01)
*H01L 21/203* (2006.01)

(52) U.S. Cl.
CPC ............ *C23C 14/352* (2013.01); *C23C 14/54* (2013.01); *H01J 37/3408* (2013.01); *H01J 37/3414* (2013.01); *H01J 37/3447* (2013.01); *H01L 21/203* (2013.01)

(58) Field of Classification Search
CPC ............... H01J 37/3447; H01J 37/3408; H01J 37/3414; H01L 21/203; C23C 14/044; C23C 14/34; C23C 14/352; C23C 14/54

USPC ...................................... 204/298.11, 298.07
See application file for complete search history.

(56) References Cited

U.S. PATENT DOCUMENTS

| | | | | |
|---|---|---|---|---|
| 4,412,906 A * | 11/1983 | Sato | ........................ | H01L 21/31 204/192.12 |
| 4,523,985 A * | 6/1985 | Dimock | ................ | C23C 14/566 118/50 |
| 5,514,259 A * | 5/1996 | Shiota | ................. | H01J 37/3405 204/192.12 |
| 5,922,133 A * | 7/1999 | Tepman | .................. | C23C 14/50 118/503 |
| 7,879,201 B2 * | 2/2011 | Druz | ..................... | C23C 14/044 204/192.11 |
| 9,437,404 B2 * | 9/2016 | Abarra | .................... | C23C 14/35 |
| 2008/0141942 A1 * | 6/2008 | Brown | .................. | C23C 14/564 118/723 R |

(Continued)

FOREIGN PATENT DOCUMENTS

CN     105980595 A      9/2016
JP     2002-194540    *  7/2002

(Continued)

*Primary Examiner* — Rodney G McDonald
(74) *Attorney, Agent, or Firm* — Fenwick & West LLP

(57) ABSTRACT

A sputtering device includes a processing chamber where a substrate is accommodated, and a slit plate that partitions the processing chamber into a first space where a target member is disposed and a second space where the substrate is disposed. The slit plate includes an inner member having an opening that penetrates therethrough in a thickness direction of the slit plate, and an outer member disposed around the inner member. The inner member is attachable to and detachable from the outer member.

12 Claims, 11 Drawing Sheets

(56) References Cited

U.S. PATENT DOCUMENTS

2017/0018412 A1\* 1/2017 Ueki ................ H01J 37/32715
2018/0155817 A1   6/2018 Takei et al.

FOREIGN PATENT DOCUMENTS

| JP | 2008-201647 A | 9/2008 |
| JP | 2015-67856 A | 4/2015 |
| JP | 2016-033266 A | 3/2016 |
| JP | 2017-172028 A | 9/2017 |
| KR | 10-2018-0064995 A | 6/2018 |

\* cited by examiner

SPUTTERING DEVICE

CROSS-REFERENCE TO RELATED APPLICATION

This application claims priority to Japanese Patent Application No. 2018-120503 filed on Jun. 26, 2018 and Japanese Patent Application No. 2018-167204 filed on Sep. 6, 2018, the entire contents of which are incorporated herein by reference.

TECHNICAL FIELD

The present disclosure relates to a sputtering device.

BACKGROUND

There is known a sputtering device for forming a film by allowing particles emitted from a target member to be incident on a substrate (see, e.g., Japanese Patent Application Publication No. 2008-201647). In addition, there is known a sputtering device for forming a film on a substrate by allowing sputtering particles to be emitted to a substrate from a target member disposed obliquely with respect to the surface of the substrate and to pass through an opening of a slit plate disposed between the target member and the substrate (see, e.g., Japanese Patent Application Publication No. 2015-067856.)

The present disclosure provides a technique capable of easily changing a shape of an opening.

SUMMARY

In accordance with an aspect of the present disclosure, there is provided a sputtering device including: a processing chamber where a substrate is accommodated; and a slit plate that partitions the processing chamber into a first space where a target member is disposed and a second space where the substrate is disposed, wherein the slit plate includes: an inner member having an opening that penetrates therethrough in a thickness direction of the slit plate; and an outer member disposed around the inner member, and wherein the inner member is attachable to and detachable from the outer member.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
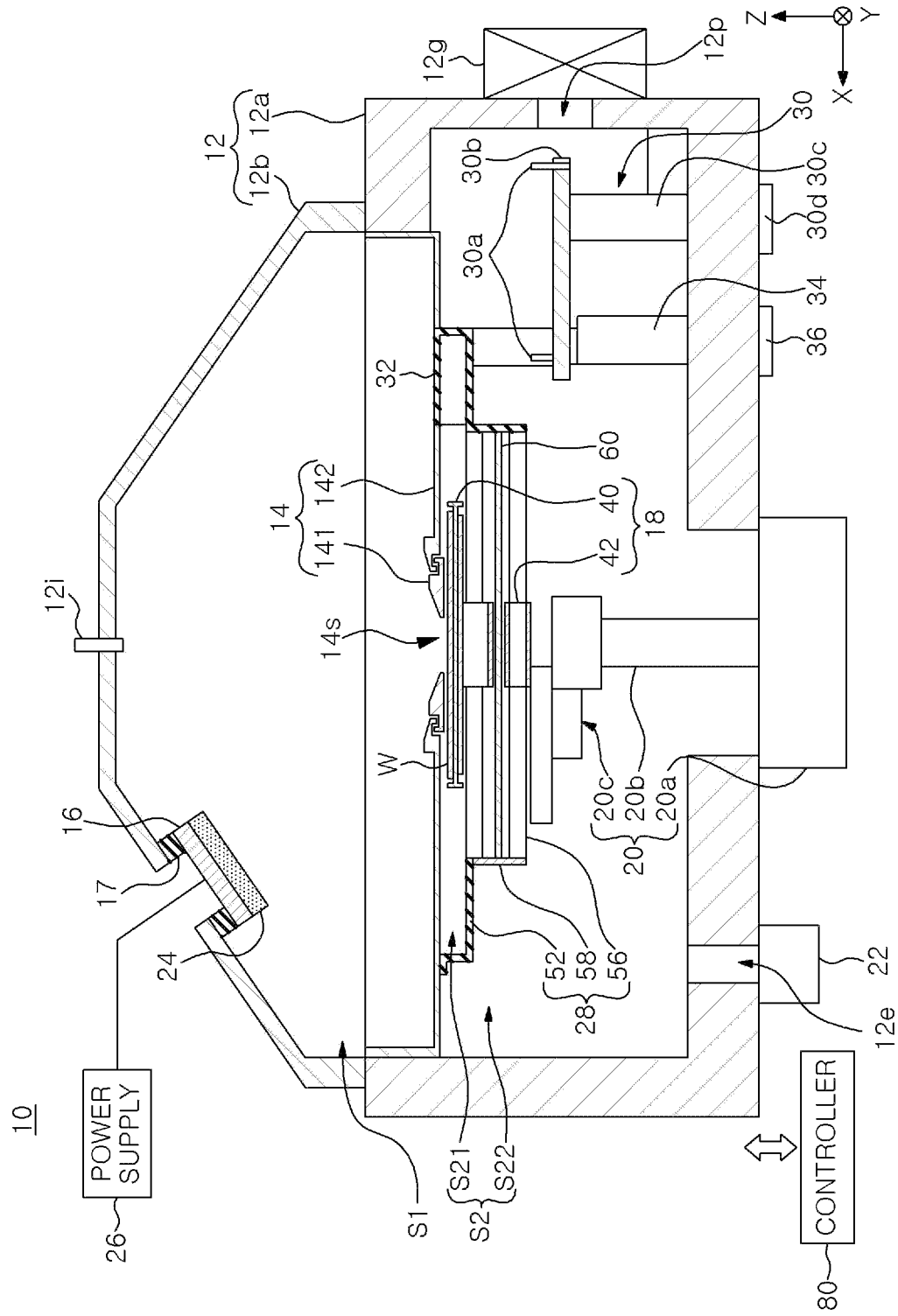
FIG. 1 is a cross sectional view showing a configuration example of a sputtering device of a first embodiment.

Hereinafter, embodiments will be described in detail with reference to the accompanying drawings. Like reference numerals will be given to like or corresponding parts throughout the drawings, and redundant description thereof will be omitted.

First Embodiment (Sputtering Device)

Figure 2:
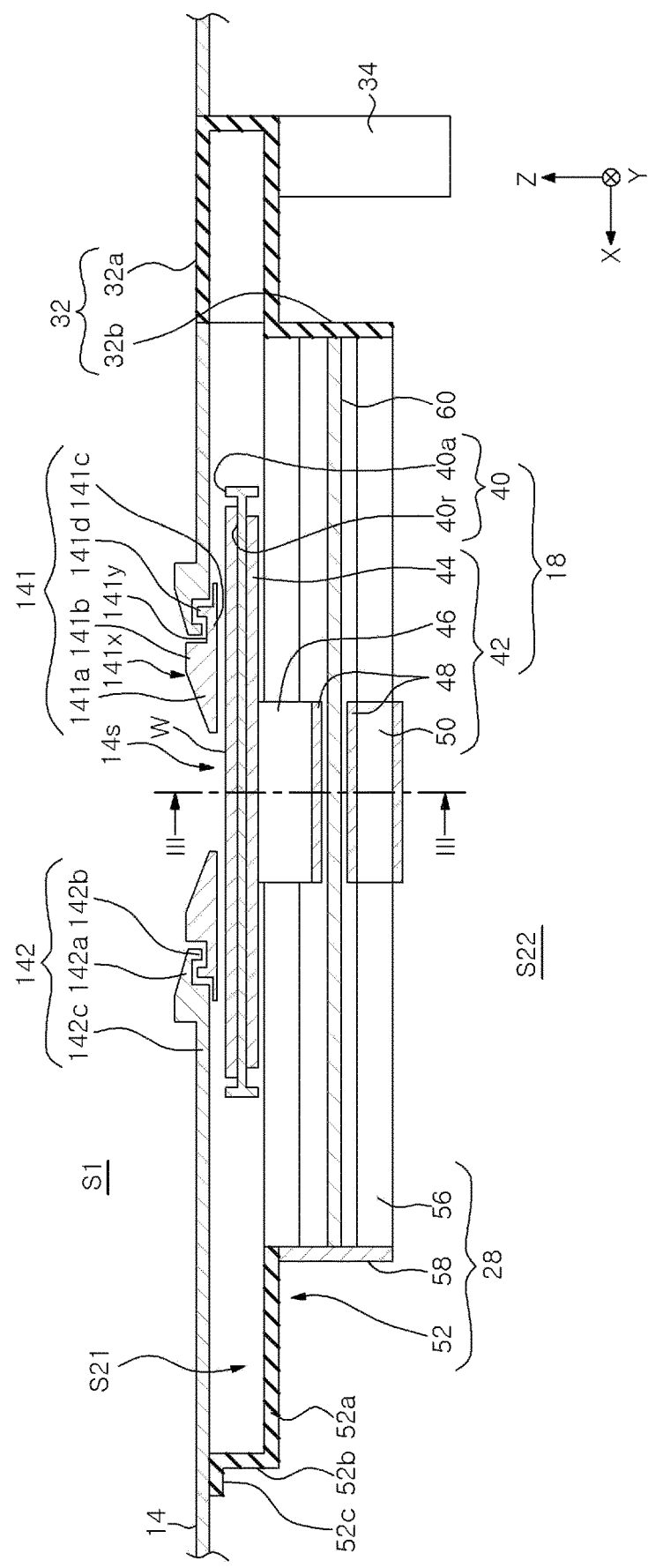
FIG. 2 is a cross sectional view (1) showing a configuration example of a slit plate.
Figure 3:
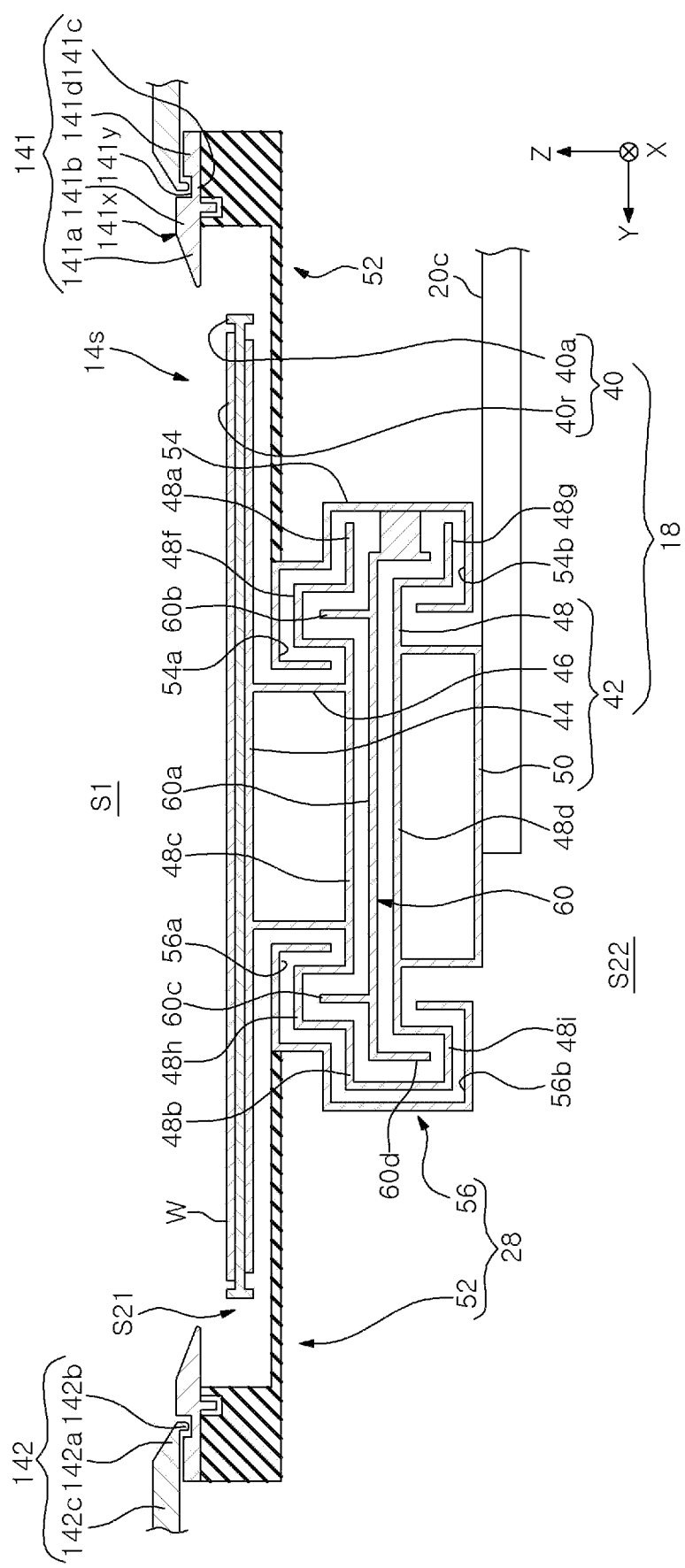
FIG. 3 is a cross sectional view (2) showing the configuration example of the slit plate.
Figure 4:
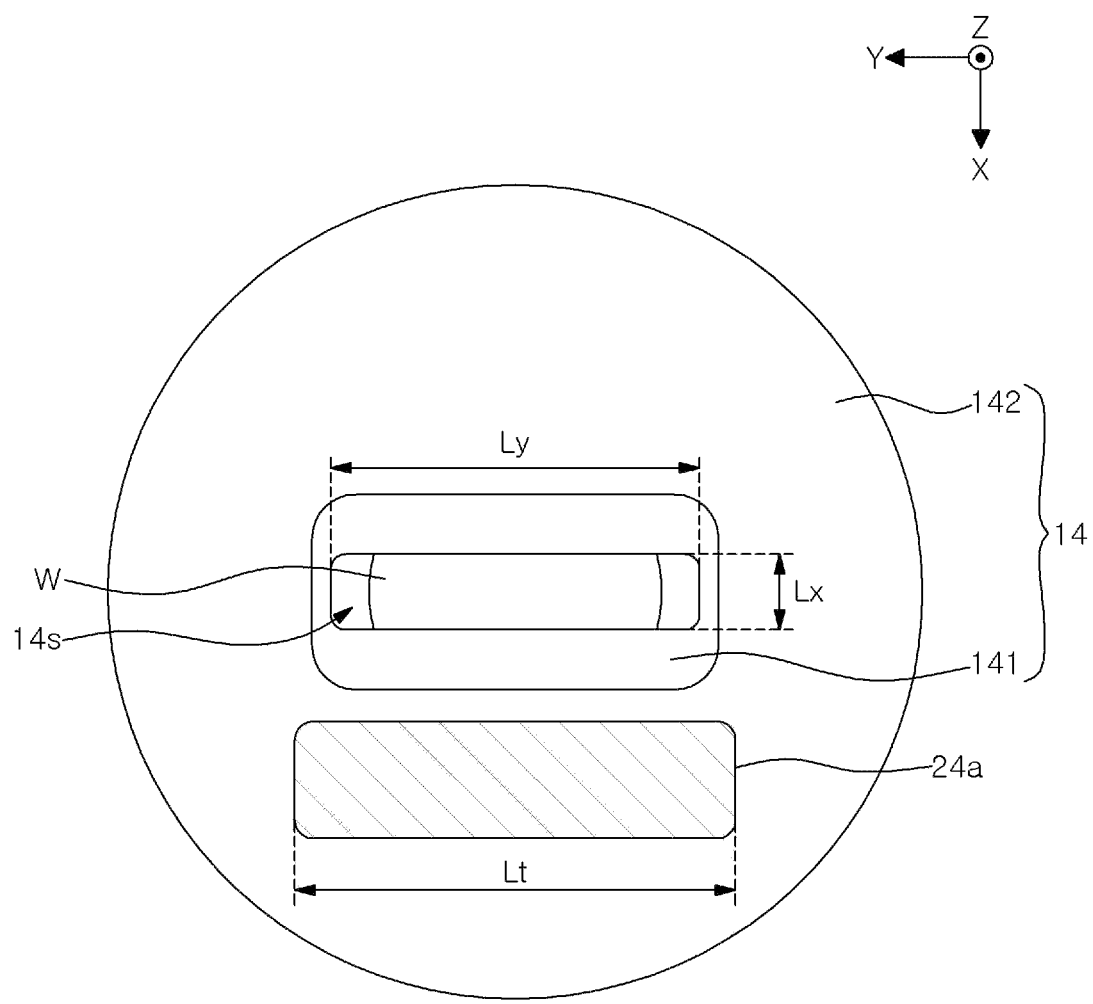
FIG. 4 is a plan view showing the configuration example of the slit plate.

A configuration example of a sputtering device of a first embodiment will be described. FIG. 1 is a cross sectional view showing the configuration example of the sputtering device of the first embodiment. FIG. 2 is a cross sectional view showing a configuration example of a slit plate, and is an enlarged view showing a part including the slit plate of the sputtering device shown in FIG. 1. FIG. 3 is a cross sectional view showing the configuration example of the slit plate, and shows a cross section taken along a dashed-dotted line in FIG. 2. FIG. 4 is a plan view showing the configuration example of the slit plate viewed from the top.

As shown in FIG. 1, the sputtering device 10 includes a processing chamber 12, a slit plate 14, a holder 16, a stage 18, a moving mechanism 20, and a controller 80.

The processing chamber 12 has a main body 12a and a lid 12b. The main body 12a has, e.g., a substantially cylindrical shape. An upper end of the main body 12a is opened. The lid 12b is disposed on the upper end of the main body 12a and closes the opening at the upper end of the main body 12a.

A gas exhaust port 12e is formed at a bottom portion of the processing chamber 12. A gas exhaust unit 22 is connected to the gas exhaust port 12e. The gas exhaust unit 22 includes, e.g., a pressure controller and a vacuum pump. The vacuum pump may be, e.g., a dry pump or a turbo molecular pump.

An opening 12p is formed on a sidewall of the processing chamber 12. A substrate W is loaded into and unloaded from the processing chamber 12 through the opening 12p. The opening 12p is opened and closed by a gate valve 12g.

The processing chamber 12 is provided with a port 12i for introducing a gas into the processing chamber 12, and a gas (e.g., an inert gas) from a gas supply unit is introduced into the processing chamber 12 through the port 12i.

A slit plate 14 is provided in the processing chamber 12. The slit plate 14 extends horizontally at an intermediate position in a height direction of the processing chamber 12. The slit plate 14 is formed by combining a plurality of separately manufactured members. In the example shown in FIG. 1, the slit plate 14 is formed by combining an inner member 141 and an outer member 142 that are separately manufactured.

The inner member 141 is a substantially plate-shaped member and is made of, e.g., a metal material such as aluminum, stainless steel, or the like. An opening 14s is formed in the inner member 141.

The opening 14s penetrates through the slit plate 14 in a plate thickness direction (Z direction in FIG. 1). During film formation in the sputtering device 10, the substrate W moves below the opening 14s in the X direction that is one horizontal direction. The opening 14s is elongated in the Y direction that is the other horizontal direction. For example, as shown in FIG. 4, the opening 14s has a substantially rectangular shape when viewed from the top. The Y direction is a longitudinal direction of the opening 14s and is orthogonal to the X direction. A center of the opening 14s in the Y direction substantially coincides with a center of the substrate W in the Y direction during the film formation.

A width Ly of the opening 14s in the Y direction is greater than a width (maximum width) of the substrate W in the Y direction during the film formation. The width Ly of the opening 14s in the Y direction is preferably 1.06 times or more, and more preferably 1.33 times or more greater than the width (maximum width) of the substrate W in the Y direction during the film formation. For example, when the substrate W is a wafer having a diameter of 300 mm, the width Ly is preferably 320 mm or more, and more preferably 400 mm or more. Accordingly, the deposition property of the film at the end of the substrate W is improved and the in-plane uniformity is improved.

A width Lx of the opening 14s in the X direction is smaller than a width (maximum width) of the substrate W in the X direction during the film formation. The width Lx of the opening 14s in the X direction is preferably 0.16 times or more greater than the width (maximum width) of the substrate W in the X direction during the film formation in view of the productivity.

The inner member 141 can be attached to and detached from the outer member 142. As shown in FIGS. 2 and 3, the inner member 141 has a tapered portion 141a, an inner thick portion 141b, a thin portion 141c, and an outer thick portion 141d.

The tapered portion 141a is a portion whose plate thickness is increased from an inner side toward an outer side. The tapered portion 141a is formed over the entire circumference of the inner member 141. An angle between a horizontal surface and an inclined surface in the tapered portion 141a can be determined by a positional relationship between the tapered portion 141a and a target member 24 to be described later. A tip end of the tapered portion 141a preferably has a curved surface shape (e.g., R surface shape). Accordingly, when a film is deposited on the tapered portion 141a, it is possible to suppress peeling off of the film at the tip end of the tapered portion 141a.

The inner thick portion 141b is disposed at an outer side of the tapered portion 141a and has a first plate thickness. The inner thick portion 141b is formed along an outer periphery of the tapered portion 141a. The inner member 141 has a high strength due to the inner thick portion 141b. A boundary portion 141x between an upper surface of the inner thick portion 141b and the inclined surface of the tapered portion 141a preferably has a curved surface shape (e.g., R surface shape). Accordingly, corner portions are reduced, which makes it possible to suppress, even when a film is deposited on the boundary portion 141x, peeling off of the film at the boundary portion 141x.

The thin portion 141c is disposed at an outer side of the inner thick portion 141b and has a second plate thickness smaller than the first plate thickness. The thin portion 141c is formed along an outer periphery of the inner thick portion 141b.

The outer thick portion 141d is disposed at an outer side of the thin portion 141c and has a third plate thickness greater than the second plate thickness. The outer thick portion 141d is formed along an outer periphery of the thin portion 141c. Therefore, a concave portion 141y is formed over the entire circumference of the inner member 141 by an outer surface of the inner thick portion 141b, an upper surface of the thin portion 141c, and an inner surface of the outer thick portion 141d. The outer thick portion 141d is fixed on a longer side to a first member 52 of a wall member 28 to be described later, and the fixing location is set to an outer side of the substrate W. However, the outer thick portion 141d is not fixed on a shorter side to the first member 52 of the wall member 28. In other words, the inner member 141 is fixed to the wall member 28 at a position where it is not overlapped with the substrate W when viewed from the top during the film formation. Accordingly, even when particles are generated by friction between the outer thick portion 141d and the wall member 28 due to thermal expansion or thermal contraction, it is possible to suppress adhesion of particles on the substrate W.

The outer member 142 is a substantially plate-shaped member disposed around the inner member 141, and is made of, e.g., a metal material such as aluminum, stainless steel, or the like. The material of the outer member 142 may be the same as or different from that of the inner member 141. However, it is preferable that the material of the outer member 142 is the same as that of the inner member 141 on the assumption that the deformation amount due to thermal expansion and thermal contraction occurring when the temperature changes is the same. An edge of the outer member 142 is fixed to the processing chamber 12 and partitions the first space S1 and the second space S2. The first space S1 is a part of the space in the processing chamber 12 and is disposed above the slit plate 14. The second space S2 is another part of the space in the processing chamber 12 and is disposed below the slit plate 14. As shown in FIGS. 2 and 3, the outer member 142 has a tapered portion 142a, a convex portion 142b, and a support portion 142c.

The tapered portion 142a is a portion whose plate thickness is increased from an inner side toward an outer side. The tapered portion 142a is formed over the entire circumference of the outer member 142. An angle between a horizontal surface and an inclined surface in the tapered portion 142a can be determined by a positional relationship between the tapered portion 142a and the target member 24 to be described later. For example, the angle between the horizontal surface and the inclined surface in the tapered portion 142a is preferably the same or substantially the same as that in the tapered portion 141a. A tip end of the tapered portion 142a preferably has a curved surface shape (e.g., R surface shape.) Accordingly, when a film is deposited on the tapered portion 142a, it is possible to suppress peeling off of the film at the tip of the tapered portion 142a. The convex portion 142b projecting toward the concave portion 141y of the inner member 141 is formed at the tip end of the tapered portion 142a.

The convex portion 142b projects downward from the tip end of the tapered portion 142a. The convex portion 142b is formed over the entire circumference of the tapered portion 142a. A gap is formed between the convex portion 142b and the concave portion 141y, and a path formed by the gap is bent to form a labyrinth structure. Since the labyrinth structure is formed by the convex portion 142b and the concave portion 141y, it is possible to suppress movement of particles from the target member 24 to be described later into the second space S2 through the gap between the inner member 141 and the outer member 142. Further, since the gap is formed between the convex portion 142b and the concave portion 141y, even when the inner member 141 and the outer member 142 are deformed by thermal expansion or thermal contraction, the convex portion 142b and the concave portion 141y are not in contact with each other, which makes it possible to prevent generation of particles due to friction therebetween.

The support portion 142c is disposed at an outer side of the tapered portion 142a. The support portion 142c is formed along the outer periphery of the tapered portion 142a. An outer end of the support portion 142c is fixed to an inner wall of the main body 12a.

The holder 16 is disposed above the slit plate 14. The holder 16 is made of a conductive material. The holder 16 is attached to the lid 12b via an insulating member 17. The holder 16 holds the target member 24 disposed in the first space S1. For example, the holder 16 holds the target member 24 such that the target member 24 is disposed obliquely above the opening 14s. Or, the holder 16 may hold the target member 24 such that the target member 24 is positioned directly above the opening 14s. The target member 24 has, e.g., a substantially rectangular shape, when viewed from the top. For example, as shown in FIG. 4, a width Lt of a projected image 24a in the Y direction obtained by projecting the target member 24 onto the slit plate 14 is greater than the width (maximum width) of the substrate W in the Y direction during the film formation. For example, when the substrate W is a wafer having a diameter of 300 mm, the width Lt is preferably 450 mm or more.

A power supply 26 is connected to the holder 16. When the target member 24 is made of a metal material, the power supply 26 may be a DC power supply. When the target member 24 is made of a dielectric material or an insulator, the power supply 26 may be a high frequency power supply and is electrically connected to the holder 16 through a matching unit.

The stage 18 supports the substrate W in the processing chamber 12. The stage 18 is configured to be movable. During the film formation, the stage 18 moves in a movement area S21 along a movement direction (X direction in FIG. 1). The movement area S21 is included in the second space S2 and includes a space directly below the opening 14s and a space directly below the slit plate 14. The stage 18 has one or more convex portions to suppress scattering of particles from the target member 24 into an area S22 different from the movement area S21 in the second space S2 through the opening 14s. The convex portions of the stage 18 form an upwardly and/or downwardly bent portion in a path around the stage 18 between the opening 14s and the area S22. In other words, the stage 18 forms a path of a labyrinth structure as the path around the stage 18 between the opening 14s and the area S22.

The movement area S21 is defined by the wall member 28. The wall member 28 extends along the boundary between the movement area S21 and the area S22. The wall member 28 forms a path between the opening 14s and the area S22, together with the stage 18. Due to the wall member 28 and the stage 18, the path between the opening 14s and the area S22 becomes a bent narrow path, i.e., a narrow path of a labyrinth structure.

The stage 18 is attached to the moving mechanism 20. The moving mechanism 20 moves the stage 18. The moving mechanism 20 includes a driving device 20a, a driving shaft 20b, and a multi joint arm 20c.

The driving device 20a is provided outside the processing chamber 12. The driving device 20a is attached to, e.g., the bottom portion of the processing chamber 12. A lower end of the driving shaft 20b is connected to the driving device 20a. The driving shaft 20b penetrates through the bottom portion of the main body 12a from the driving device 20a and extends upward in the processing chamber 12. The driving device 20a generates a driving force for vertically moving and rotating the driving shaft 20b. The driving device 20a may be, e.g., a motor.

One end of the multi-joint arm 20c is rotatably supported at an upper end of the driving shaft 20b. The other end of the multi joint arm 20c is attached to the stage 18. When the driving shaft 20b is rotated by the driving device 20a, the other end of the multi-joint arm 20c moves linearly along the X direction. Accordingly, the movement of the stage 18 in the movement area S21 is realized. When the driving shaft 20b is vertically moved by the driving device 20a, the multi joint arm 20c and the stage 18 are vertically moved.

A substrate lift-up mechanism 30 is disposed near the opening 12b in the area S22 of the second space S2. The substrate lift-up mechanism 30 includes a plurality of lift pins 30a, a support member 30b, a driving shaft 30c, and a driving device 30d. The lift pins 30a have a cylindrical shape extending in a vertical direction. Heights of upper ends of the lift pins 30a in the vertical direction are substantially the same. The number of the lift pins 30a may be, e.g., three. The lift pins 30a are supported by the support member 30b. The support member 30b has a substantially horseshoe shape. The lift pins 30a extend above the support member 30b. The support member 30b is supported by the driving shaft 30c. The driving shaft 30c extends downward from the support member 30b and is connected to the driving device 30d. The driving device 30d generates a driving force for vertically moving the lift pins 30a. The driving device 30d may be, e.g., a motor.

The substrate lift-up mechanism 30 allows the substrate W loaded into the processing chamber 12 from the outside of the processing chamber 12 by a transfer unit (not shown) to be transferred from the transfer unit onto the upper ends of the lift pins before it is mounted on the stage 18. Further, the substrate lift-up mechanism 30 allows the substrate W to be transferred from the stage 18 onto the upper ends of the lift pins 30a in the case of unloading the substrate W from the processing chamber 12 to the outside of the processing chamber 12. Although a plurality of through-holes into which the lift pins 30a are inserted is formed in the stage 18, the illustration of the through-holes is omitted in FIG. 1.

The wall member 28 is opened at one end in the X direction. When the stage 18 moves from the area S22 to the movement area S21, the stage 18 enters the movement area S21 through the opening at one end in the X direction of the wall member 28. When the stage 18 retreats from the movement area S21 to the area S22, the stage 18 passes through the opening at one end in the X direction of the wall member 28.

Figure 6:
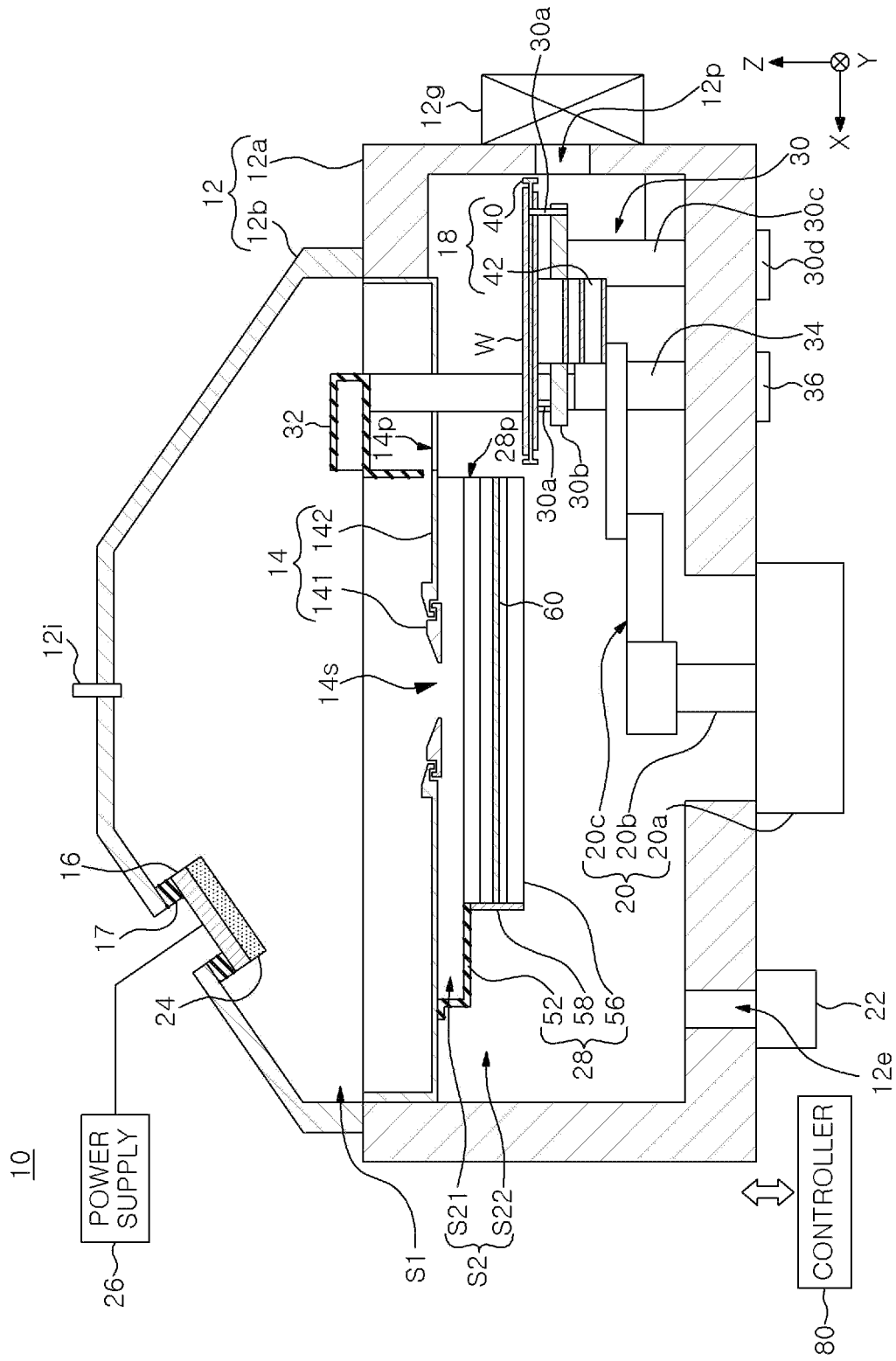
FIG. 6 is a cross sectional view (3) showing the configuration example of the sputtering device of the first embodiment.

The sputtering device 10 includes a lid 32 for opening and closing the opening at one end of the wall member 28. The lid 32 is supported by a driving shaft 34. The driving shaft 34 extends downward from the lid 32, and is connected to the driving device 36. The driving device 36 generates a driving force for vertically moving the lid 32. The driving device 36 may be, e.g., a motor. As shown in FIG. 6 to be described later, the driving device 36 allows the lid 32 to retreat from the second space S2 to the first space S1 by moving the lid 32 upward. An opening 14p is formed in the slit plate 14, so that the lid 32 retreats from the second space S2 to the first space S1 through the opening 14p. When the lid 32 closes an opening 28p at one end of the wall member 28, the opening 14p of the slit plate 14 is also closed. The components such as the slit plate 14, the lid 32, the driving device 36, and the like may be configured such that the lid 32 moves in the Y direction to open and close the opening 28p at one end in the Y direction of the wall member 28. Further, the components such as the slit plate 14, the lid 32, the driving device 36, and the like may be configured such that the lid 32 moves in the X direction to open and close the opening 28p at one end in the X direction of the wall member 28.

The controller 80 controls operations of the respective components of the sputtering device 10. The controller 80 includes a central processing unit (CPU), a read only memory (ROM), and a random access memory (RAM). The CPU executes desired processing based on a recipe stored in a storage area such as the RAM or the like. Control information of the device on processing conditions is set in the recipe. The control information may include, e.g., a gas flow rate, a pressure, a temperature, and a processing time. The recipe and the program used by the controller 80 may be stored in, e.g., a hard disk or a semiconductor memory. The recipe or the like may be set to a predetermined position while being stored in a portable computer-readable storage medium such as a CD-ROM, a DVD, or the like and read out.

Hereinafter, the stage 18, the wall member 28, and the lid 32 will be described in detail.

The stage 18 has a mounting unit 40 and a supporting unit 42.

The mounting unit 40 has, e.g., a substantially plate shape extending in the X direction and the Y direction. The mounting unit 40 has a mounting area 40r for mounting thereon the substrate W. The mounting unit 40 has a convex portion 40a that projects upward from the mounting area 40r to surround the mounting area 40r.

The supporting unit 42 is disposed below the mounting unit 40. The supporting unit 42 supports the mounting unit 40. The supporting unit 42 has an upper portion 44, a connecting portion 46, a hollow portion 48, and a lower portion 50.

The upper portion 44 has a flat plate shape and extends in the X direction and the Y direction. The mounting unit 40 is fixed to the upper portion 44 in a state where a bottom surface of the mounting unit 40 is in contact with an upper surface of the upper portion 44.

The connecting portion 46 extends downward from the bottom surface of the upper portion 44 and is connected to the hollow portion 48. The connecting portion 46 has a pair of flat plate portions. Each of the flat plate portions has a flat plate shape and extends in the X direction and the Z direction. Upper ends of the flat plate portions of the connecting portion 46 are connected to the bottom surface of the upper portion 44, and lower ends of the flat plate portions of the connecting portion 46 are connected to the hollow portion 48.

The hollow portion 48 has a hollow shape. The hollow portion 48 is made of a plate material bent at a plurality of locations, and extends along an inner space thereof and a boundary between the inner space and an outside. When the stage 18 is disposed in the movement area S21, a shielding member 60 to be described later is positioned in an inner space of the hollow portion 48. The hollow portion 48 is opened at both ends in the X direction.

The hollow portion 48 has two edge portions 48a and 48b on both sides in the Y direction. The two edge portions 48a and 48b extend in the X direction. The edge portion 48a forms an opening directed outward in the Y direction. The opening of the edge portion 48a is connected to the inner space of the hollow portion 48. On the other hand, the edge portion 48b closes the inner space of the hollow portion 48.

The hollow portion 48 has two flat plate portions 48c and 48d. The flat plate portions 48c and 48d are disposed between the edge portions 48a and 48b, and extend in the X direction and the Y direction. The flat plate portions 48c and 48d are substantially in parallel with each other. The flat plate portion 48c is separated upward from the flat plate portion 48d. A lower end of the connecting portion 46 is connected to the flat plate portion 48c.

The edge portion 48a forms convex portions 48f and 48g. The edge portion 48b forms convex portions 48h and 48i. The convex portions 48f and 48h are formed at both sides in the Y direction of the flat plate portion 48c. The convex portions 48f and 48h protrude upward from the flat plate portion 48c and extend in the X direction. The convex portions 48g and 48i are formed at both sides in the Y direction of the flat plate portion 48d. The convex portions 48g and 48i project downward from the flat plate portion 48d and extend in the X direction.

The lower portion 50 is connected to the bottom surface of the flat plate portion 48d. The lower portion 50 forms a square tube shape opened at one end and the other end in the X direction, together with the flat plate portion 48d. The other end of the multi joint arm 20c of the moving mechanism 20 is connected to the lower portion 50.

The wall member 28 extends along the boundary between the movement area S21 and the area S22, and defines the movement area S21. The wall member 28 has a first member 52, second members 54 and 56, and a third member 58.

The first member 52 defines a movement area of the mounting unit 40 and the upper portion 44 of the supporting unit 42 in the movement area S21. The first member 52 is made of a plate material bent at a plurality of locations. The first member 52 forms an opening opened and closed by a part of the lid 32 at one end in the X direction. The first member 52 has a bottom portion 52a, an intermediate portion 52b, and an upper portion 52c.

The bottom portion 52a is spaced downward from the slit plate 14 and extends in the X direction and the Y direction. An opening is formed at the bottom portion 52a. When the stage 18 is disposed in the movement area S21, the connecting portion 46 of the supporting unit 42 of the stage 18 is disposed at the opening of the bottom portion 52a. The intermediate portion 52b extends upward from the edge of the bottom portion 52a except for one end thereof in the X direction. The upper portion 52c extends in a flange shape from the upper end of the intermediate portion 52b and is connected to the slit plate 14.

The second member 54 surrounds the edge portion 48a to form a slight gap between the second member 54 and the edge portion 48a of the hollow portion 48. Specifically, the second member 54 surrounds the convex portions 48f and 48g. The second member 54 is made of a plate material bent at a plurality of locations. The second member 54 forms concave portions 54a and 54b. The convex portion 48f of the stage 18 is inserted into the concave portion 54a. The convex portion 48g of the stage 18 is inserted into the concave portion 54b.

The second member 56 surrounds the edge portion 48b to form a slight gap between the second member 56 and the edge portion 48b of the hollow portion 48. Specifically, the second member 56 surrounds the convex portions 48h and 48i. The second member 56 is made of a plate material bent at a plurality of locations. The second member 56 forms concave portions 56a and 56b. The convex portion 48h of the stage 18 is inserted into the concave portion 56a. The convex portion 48i of the stage 18 is inserted into the concave portion 56b.

Upper portions of the second members 54 and 56 have a flat plate shape extending in the X direction and the Y direction. The upper portions of the second members 54 and 56 are disposed in the opening of the bottom portion 52a of the first member 52. The upper portions of the second members 54 and 56 are connected to an end surface defining the opening of the bottom portion 52a of the first member 52.

The second members 54 and 56 are separated from each other in the Y direction. When the stage 18 is disposed in the movement area S21, the connecting portion 46 of the supporting unit 42 of the stage 18 is disposed between the upper portion of the second member 54 and the upper portion of the second member 56. When the stage 18 is disposed in the movement area S21, the lower portion 50 of the supporting unit 42 of the stage 18 is disposed between the upper portion of the second member 54 and the upper portion of the second member 56.

The second members 54 and 56 are opened at one end and the other end in the X direction. The openings at one ends of the second members 54 and 56 in the X direction are a part of the openings at one end of the wall member 28 in the X direction. The third member 58 is connected to the other ends of the second members 54 and 56 in the X direction to close the other end of the movement area S21 in the X direction.

The lid 32 opens and closes an opening at one end of the wall member 28 in the X direction. The lid 32 has an upper portion 32a and a lower portion 32b. The upper portion 32a has a box shape. The upper portion 32a forms an opening so that an inner space thereof can be connected to the movement area S21 when the lid 32 closes one end of the movement area S21 in the X direction. The lower portion 32b extends downward from an end portion that forms the opening of the upper portion 32a. When the lid 32 closes one end of the movement area S21 in the X direction, the lower portion 32b closes the openings at one ends of the second members 54 and 56 in the X direction and an opening formed between one end of the second member 54 and one end of the second member 56 in the X direction. The lower portion 32b of the lid 32 has a flat plate shape extending in the Y direction and the Z direction.

The sputtering device 10 further includes the shielding member 60. The shielding member 60 is disposed in the movement area S21. When the stage 18 is disposed in the movement area S21, the shielding member 60 is partially disposed in the inner space of the hollow portion 48 of the stage 18.

The shielding member 60 has a flat plate portion 60a and convex portions 60b, 60c and 60d. The flat plate portion 60a extends substantially in parallel to the opening 14s. The flat plate portion 60a extends in the X direction and the Y direction. The convex portions 60b and 60c are formed at both sides in the Y direction with respect to the flat plate portion 60a, and project upward from the flat plate portion 60a. The convex portion 60d is formed at an outer side of the convex portion 60c in the Y direction, and projects downward from the flat portion 60a. The convex portions 60b, 60c and 60d have a flat plate shape extending in the X direction and the Z direction. The shielding member 60 is fixed to the second member 54 at the end portion opposite to the convex portion 60d in the X direction. When the stage 18 is disposed in the movement area S21, the convex portion 60b is partially disposed in the inner space of the convex portion 48f. When the stage 18 is disposed in the movement area S21, the convex portion 60c is partially disposed in the inner space of the convex portion 48h. When the stage 18 is disposed in the movement area S21, the convex portion 60d is partially disposed in the inner space of the convex portion 48i.

In the sputtering device 10, a path around the stage 18 between the opening 14s and the area S22 is bent by the convex portions 48f, 48g, 48h and 48i formed at the stage 18 to form a labyrinth structure. Accordingly, scattering of particles from the target member 24 into the area S22 is suppressed, and unnecessary deposition of the particles from the target member 24 is suppressed. In addition, since the convex portions 48f, 48g, 48h and 48i are formed at the stage 18, it is possible to suppress the unnecessary scattering and the unnecessary deposition of particles from the target member 24 without increasing the number of components.

The sputtering device 10 further includes the above-mentioned wall member 28. Due to the wall member 28, the width of the path between the opening 14s and the area S22 is further reduced, which makes it possible to further suppress the scattering of particles from the target member 24 into the area S22. The sputtering device 10 further includes the shielding member 60. The shielding member 60 further suppresses the scattering of particles from the target member 24 into the area S22. Even when the film forming process is performed in a state where the stage 18 is not disposed in the movement area S21, the scattering of particles from the target member 24 into the area S22 is suppressed by the shielding member 60.

(Operation of the Sputtering Device)

Figure 5:
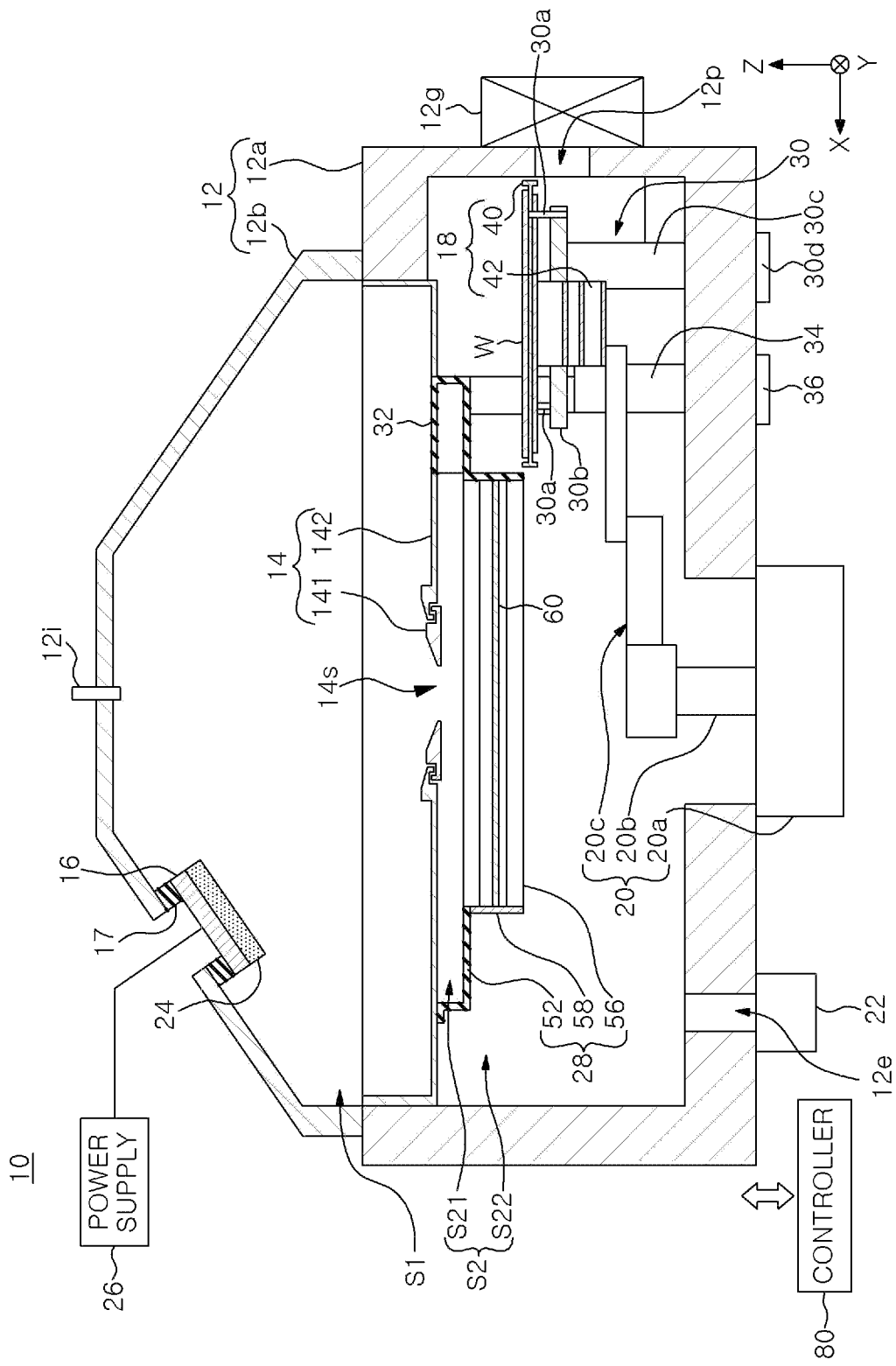
FIG. 5 is a cross sectional view (2) showing the configuration example of the sputtering device of the first embodiment.

The operation of the sputtering device 10 of the first embodiment will be described with reference to FIGS. 1, 5 and 6. FIG. 5 is a cross sectional view showing the configuration example of the sputtering device 10 of the first embodiment and shows a state in which the substrate W is mounted on the stage 18. FIG. 6 is a cross sectional view showing the configuration example of the sputtering device 10 of the first embodiment, and shows a state in which the lid 32 is moved upward so that the substrate W can be disposed in the movement area S21. The operation of the sputtering device 10 which will be described below is performed by controlling the respective components of the sputtering device 10 under the control of the controller 80.

First, the opening 12p is opened by opening the gate valve 12g. Then, the substrate W is loaded into the processing chamber 12 by a transfer device of a transfer module connected to the sputtering device 10. In the case of loading the substrate W, the lift pins 30a and the stage 18 retreat to a position below the area where the substrate W is loaded to prevent interference with the substrate W.

Then, the lift pins 30a are moved upward to receive the substrate W from the transfer device of the transfer module. At this time, the substrate W is supported on the upper ends of the lift pins 30a. After the substrate W is supported by the lift pins 30a, the transfer device of the transfer module retreats from the inside of the processing chamber 12 to the outside of the processing chamber 12. Next, the opening 12p is closed by closing the gate valve 12g.

Next, as shown in FIG. 5, the substrate W is transferred from the lift pins 30a to the stage 18 by moving the stage 18 upward or moving the lift pins 30a downward. Then, as shown in FIG. 6, the lid 32 is moved upward to retreat into the first space S1. Next, the stage 18 is moved into the movement area S21, and the opening 28p at one end of the wall member 28 is closed by the lid 32.

Next, a gas is introduced into the processing chamber 12 from the port 12i, and a pressure in the processing chamber 12 is set to a predetermined pressure by the gas exhaust unit 22. A voltage is applied to the holder 16 by the power supply 26. When the voltage is applied to the holder 16, the gas in the processing chamber 12 is dissociated, and ions collide with the target member 24. When the ions collide with the target member 24, particles of a material forming the target member 24 are released from the target member 24. The particles released from the target member 24 pass through the opening 14s and are deposited on the substrate W. At this time, the substrate W is moved in the X direction. Accordingly, a film of the material forming the target member 24 is formed on the surface of the substrate W.

As described above, in the sputtering device 10 of the first embodiment includes the slit plate 14 for partitioning the processing chamber 12 into the first space S1 in which the target member 24 is disposed and the second space S2 in which the substrate W is disposed. The slit plate 14 includes the inner member 141 having the opening 14s penetrating therethrough in a plate thickness direction, and the outer member 142 disposed around the inner member 141. The inner member 141 can be attached to and detached from the outer member 142. Therefore, the shape of the opening 14s can be changed by exchanging only the inner member 141 that is a part of the slit plate 14. Accordingly, the shape of the opening can be easily changed.

Further, in accordance with the sputtering device 10 of the first embodiment, the connection location between the inner member 141 and the outer member 142 has a labyrinth structure. Therefore, it is possible to suppress the movement of particles from the target member 24 into the second space S2 through the space between the inner member 141 and the outer member 142. Further, since a gap is formed between the convex portion 142b and the concave portion 141y, the convex portion 142b and the concave portion 141y are not in contact with each other even when the inner member 141 and the outer member 142 are deformed by thermal expansion or thermal contraction. Accordingly, the generation of particles due to friction therebetween can be prevented.

Further, in accordance with the sputtering device 10 of the first embodiment, the inner member 141 is connected to the wall member 28 at a side of a shorter edge of the opening 14s. Therefore, even when particles are generated by the friction between the outer thick portion 141d and the wall member 28 due to thermal expansion or thermal contraction, it is possible to suppress adhesion of the particles on the substrate W.

Further, in accordance with the sputtering device 10 of the first embodiment, the inner member 141 has the tapered portion 141a whose thickness is decreased from the outer periphery toward the center, and a corner of a central side of the tapered portion 141a is rounded. Accordingly, when the film is deposited on the tapered portion 141a, it is possible to suppress the peeling off of the film at the tip end of the tapered portion 141a.

Second Embodiment

Figure 7:
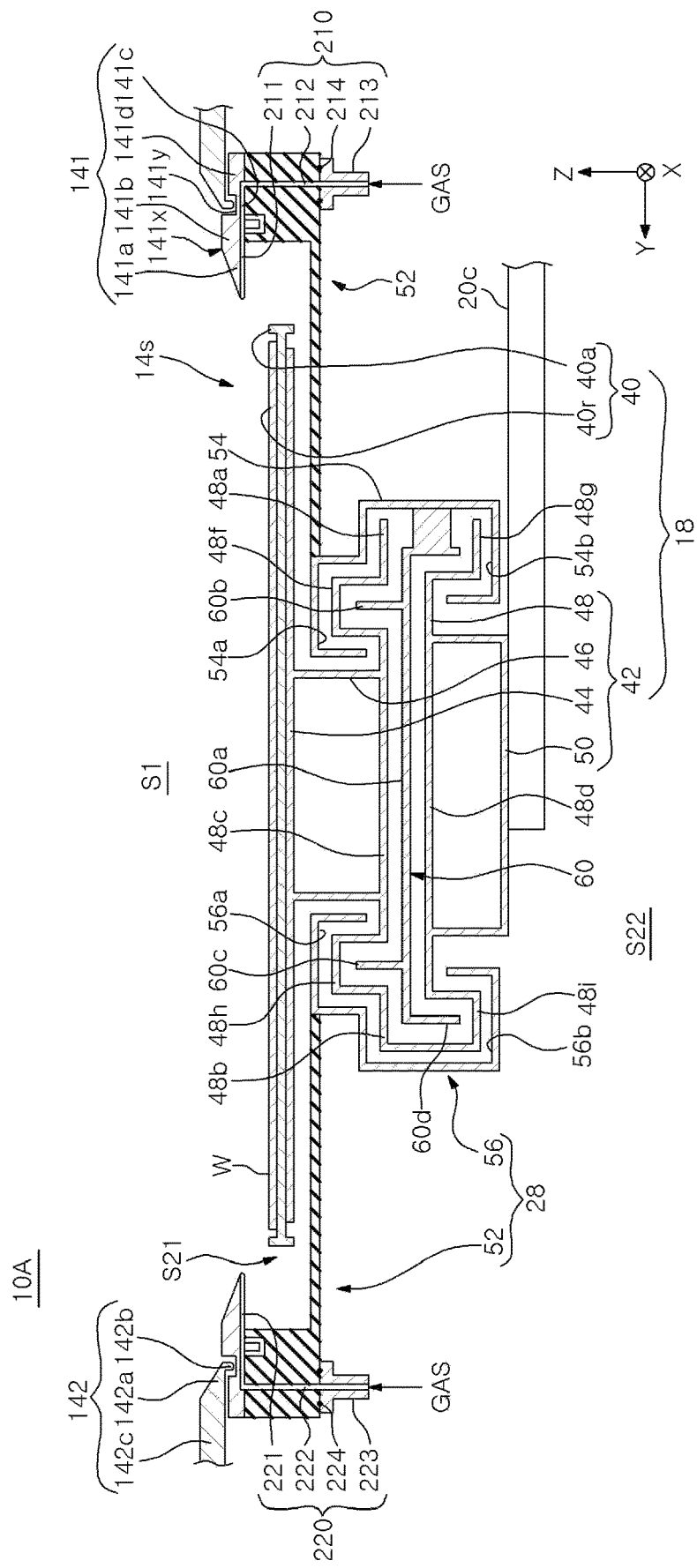
FIG. 7 explains a sputtering device of a second embodiment.
Figure 8:
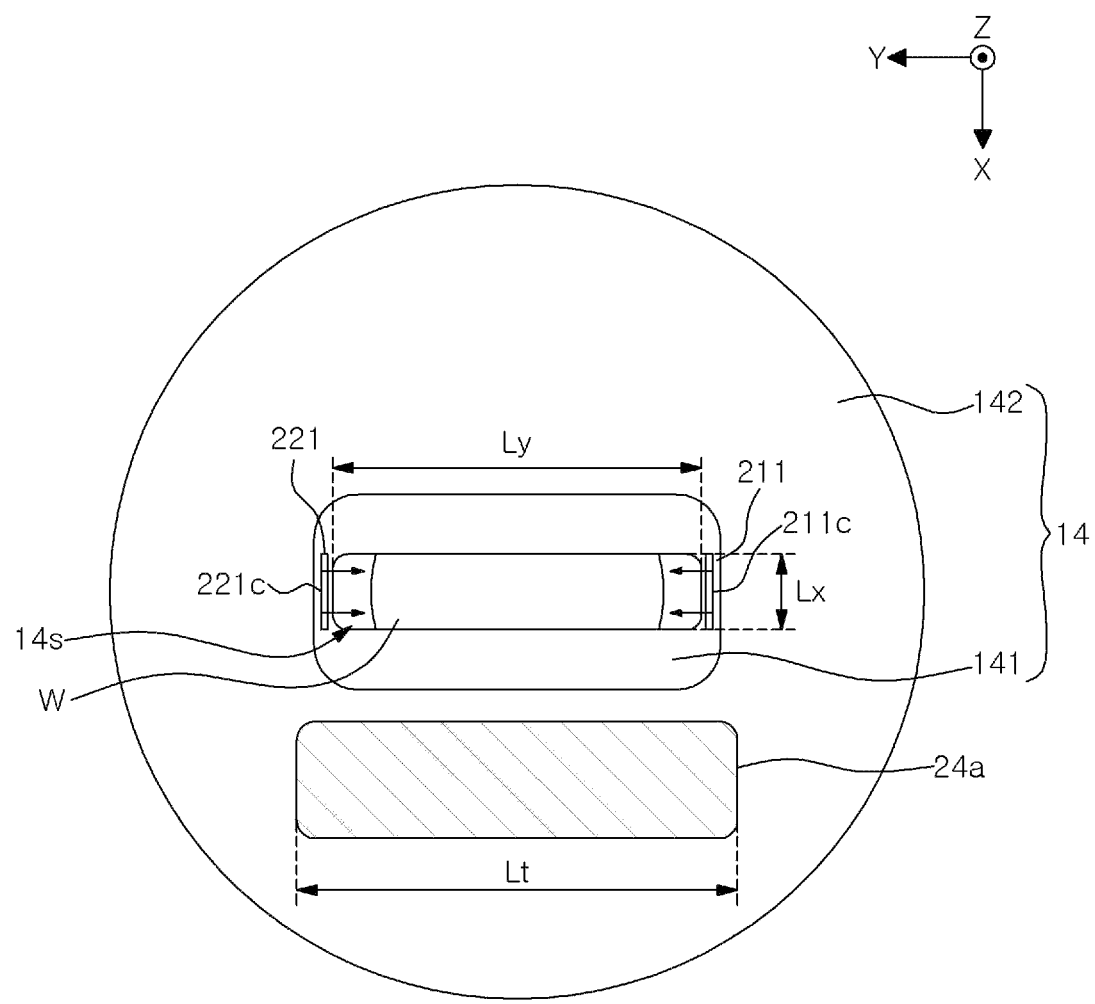
FIG. 8 shows an example of a gas supply unit of the sputtering device shown in FIG. 7.

Hereinafter, a configuration example of the sputtering device of the second embodiment will be described. FIG. 7 explains the sputtering device of the second embodiment, and shows a cross section taken along the longitudinal direction of the opening 14s, similarly to FIG. 3. FIG. 8 shows an example of a gas supply unit of the sputtering device shown in FIG. 7.

As shown in FIG. 7, a sputtering device 10A of the second embodiment is different from the sputtering device 10 of the first embodiment in that it includes gas supply units 210 and 220 for supplying a gas from the inside of the inner member 141 toward the substrate W. The other configurations may be the same as those of the sputtering device 10 of the first embodiment. Hereinafter, differences from the sputtering device 10 of the first embodiment will be mainly described.

The gas supply unit 210 includes a gas injection hole 211, a gas channel 212, and a gas inlet flange 213.

The gas injection hole 211 is formed at one side of the inner member 141 in the longitudinal direction of the opening 14s (−Y direction side in FIG. 7) and injects the gas toward the opening 14s. For example, as shown in FIG. 8, the gas injection hole 211 is formed as a long hole extending along a shorter edge (X direction in FIG. 8) of the opening 14s. A longitudinal length of the gas injection hole 211 may be substantially the same as, e.g., the width Lx of the opening 14s. Accordingly, the gas can be uniformly supplied to the opening 14s. The longitudinal length of the gas injection hole 211 may be greater than or smaller than the width Lx of the opening 14s. Further, the gas injection hole 211 may be formed as a plurality of holes arranged along the shorter edge of the opening 14s. In that case, the distribution of the gas supplied to the opening 14s can be controlled by controlling the size of each of the holes.

The gas channel 212 is formed by a through-hole penetrating through the first member 52 in a plate thickness direction thereof (Z direction in the drawing.) The gas channel 212 has one end connected to the gas injection hole 211 and the other end connected to the gas inlet flange 213. The gas inlet flange 213 is attached to a bottom surface of the first member 52 via a seal member 214, and introduces a gas supplied from a gas supply source (not shown) into the gas channel 212. The gas supplied from the gas supply source may be a reactant gas, e.g., oxygen ($O_2$) gas, nitrogen ($N_2$) gas, or a gaseous mixture of $O_2$ gas and $N_2$ gas.

The gas supply unit 220 is disposed to face the gas supply unit 210 with the opening 14s interposed therebetween. The gas supply unit 220 has a gas injection hole 221, a gas channel 222, and a gas inlet flange 223.

The gas injection hole 221 is formed at the other side of the inner member 141 in the longitudinal direction of the opening 14s (+Y direction in FIG. 7), and injects a gas toward the opening 14s. For example, as shown in FIG. 8, the gas injection hole 221 is formed as a long hole extending along the shorter edge (X direction in the drawing) of the opening 14s. A longitudinal length of the gas injection hole 221 may be the same as, e.g., the longitudinal length of the gas injection hole 211. Similarly to the gas injection hole 211, the gas injection hole 221 may be formed as a plurality of holes arranged along the shorter edge of the opening 14s. In that case, the distribution of the gas supplied to the opening 14s can be controlled by controlling the size of each of the holes.

The gas channel 222 is formed by a through hole penetrating through the first member 52 in a plate thickness direction thereof (Z direction in the drawing). The gas channel 222 has one end connected to the gas injection hole 221 and the other end connected to the gas inlet flange 223. The gas inlet flange 223 is attached to the bottom surface of the first member 52 via a seal member 224, and introduces a gas supplied from a gas supply source (not shown) into the gas channel 222. The gas supplied from the gas supply source may be a reactant gas, e.g., $O_2$ gas, $N_2$ gas, or a gaseous mixture of $O_2$ gas and $N_2$ gas.

In the sputtering device 10A having the gas supply units 210 and 220, the gas supplied from the gas supply source is supplied to the gas channels 212 and 222 by the gas inlet flanges 213 and 223 and is injected toward the substrate W from the gas injection holes 211 and 221.

As described above, in accordance with the sputtering device 10A of the second embodiment, the following effects are realized in addition to the effects realized by the sputtering device 10 of the first embodiment.

In accordance with the sputtering device 10A, the gas injection holes 211 and 221 are formed near the substrate W that moves below the opening 14s in the X direction that is one horizontal direction and, thus, the gas can be efficiently supplied to the substrate W.

Further, in accordance with the sputtering device 10A, the inner member 141 can be separated from the outer member 142. Therefore, if multiple types of inner members 141 in which hole diameters of the gas injection holes 211 and 221 are different are prepared, it is possible to easily realize a gas flow rate or a partial pressure suitable for the processing conditions simply by exchanging the inner member 141.

Figure 9:
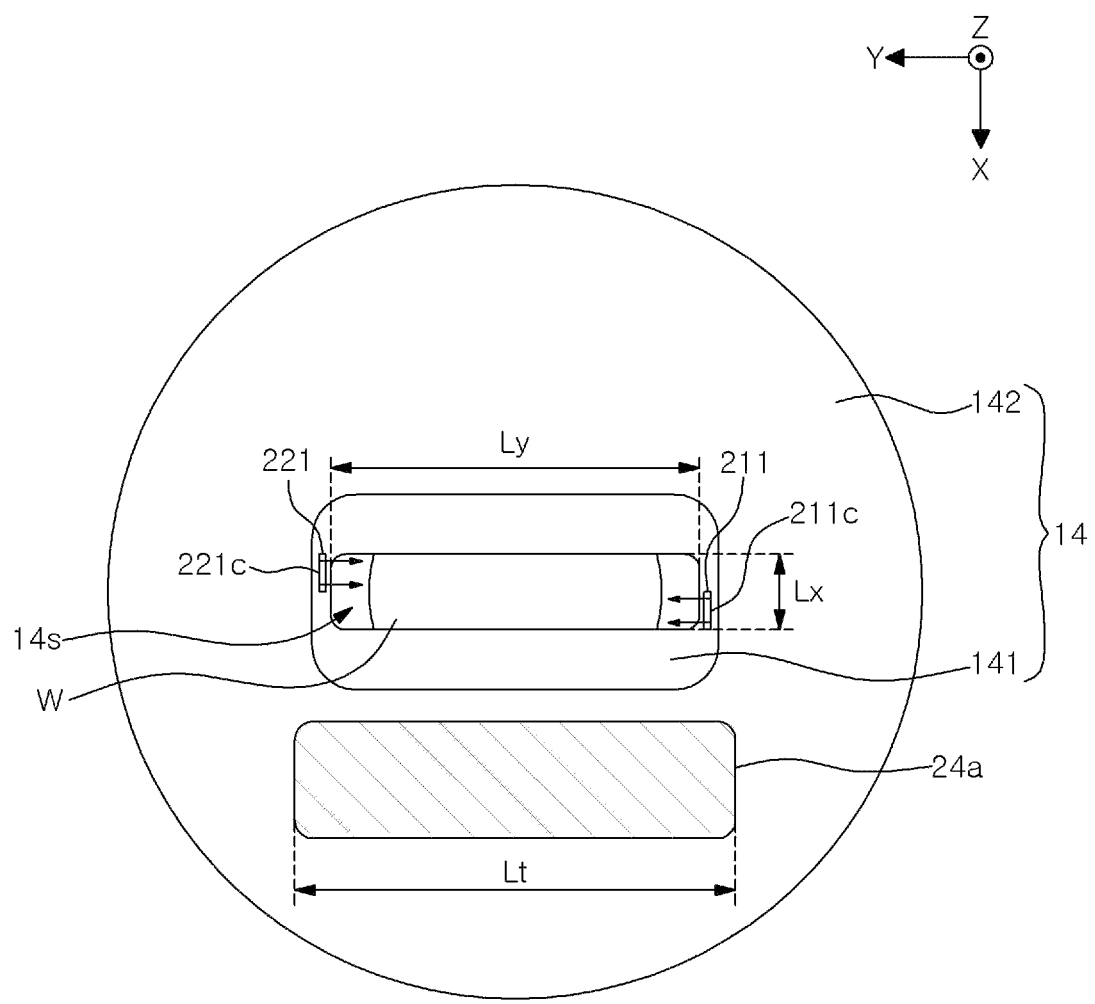
FIG. 9 shows another example of the gas supply unit of the sputtering device shown in FIG. 7.

In the above example, the case where a central axis 211c of the gas injection hole 211 and a central axis 221c of the gas injection hole 221 coincide with each other has been described. However, the present disclosure is not limited thereto. FIG. 9 shows another example of the gas supply unit of the sputtering device shown in FIG. 7. As shown in FIG. 9, the gas injection holes 211 and 221 may be formed such that the central axis 211c of the gas injection hole 211 and the central axis 221c of the gas injection hole 221 do not coincide with each other.

Figure 10:
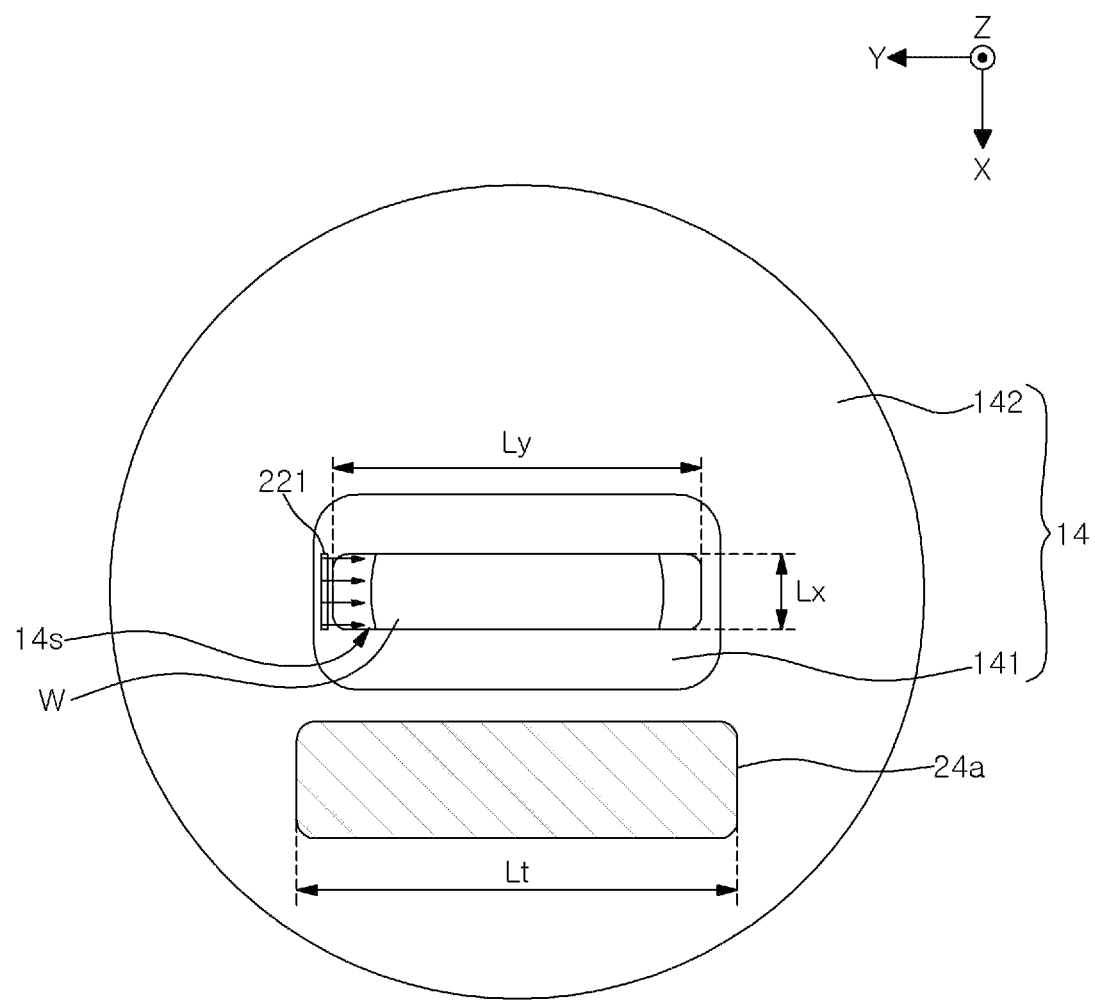
FIG. 10 shows still another example of the gas supply unit of the sputtering device shown in FIG. 7.

The gas injection hole may be formed at only one side of opposite sides of the inner member 141 in the longitudinal direction of the opening 14s. FIG. 10 shows still another example of the gas supply unit of the sputtering device shown in FIG. 7. FIG. 10 shows, as an example, the case in which the gas injection hole is formed only one side of the inner member 141 in the longitudinal direction of the opening 14s (+Y direction in FIG. 10). In other words, in the example shown in FIG. 10, the gas injection hole 211 is not formed at the inner member 141, and only the gas injection hole 221 is formed at the inner member 141.

Although the example in which the gas injection hole is formed at one or both sides of the inner member 141 in the longitudinal direction of the opening 14s has been described, the present disclosure is not limited thereto. The gas injection hole may be formed at one or both sides of the inner member 141 in the transverse direction of the opening 14s. In that case, it can be performed by forming a gas channel in the inner member 141, and it is possible to set the shape, the number, and the location of the gas injection hole depending on the processing conditions.

Third Embodiment

Figure 11:
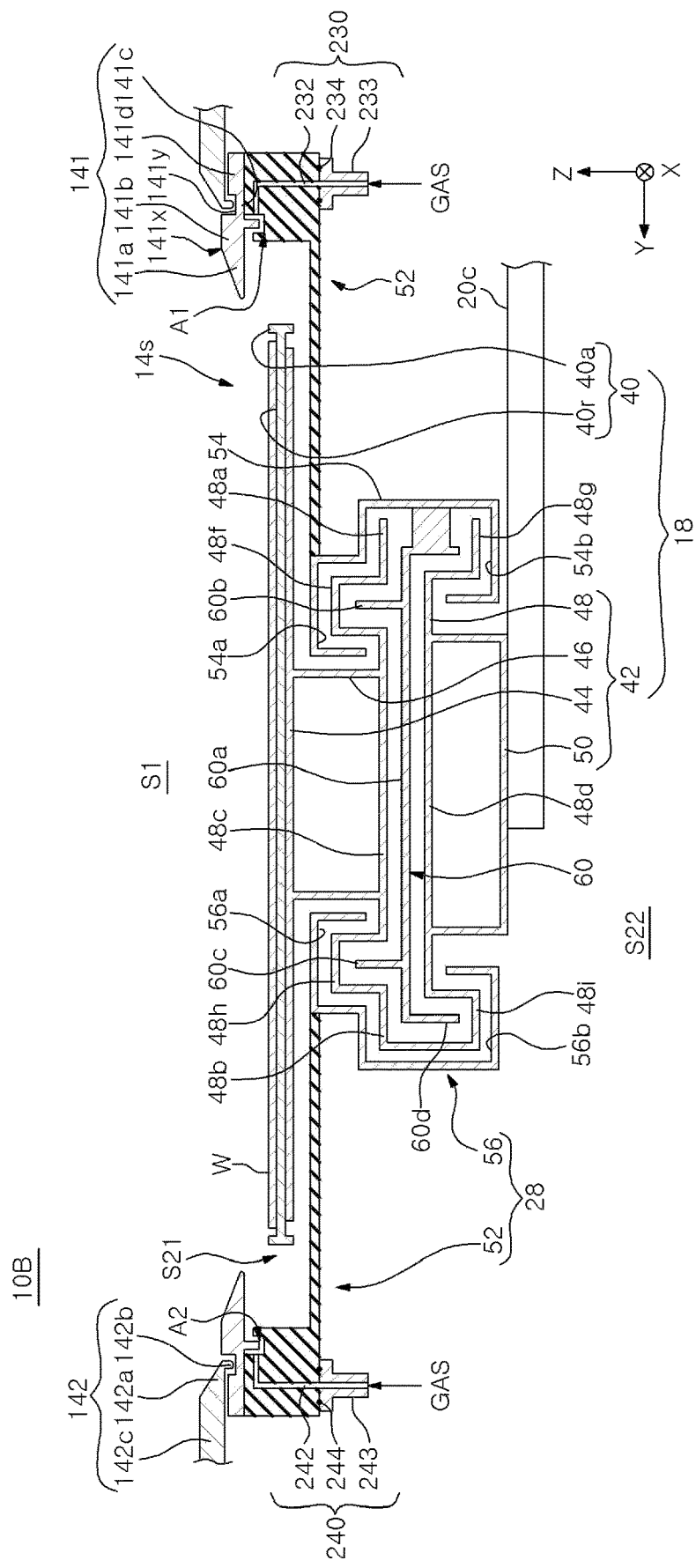
FIG. 11 explains a sputtering device of a third embodiment.

Hereinafter, a configuration example of the sputtering device of a third embodiment will be described. FIG. 11 explains the sputtering device of the third embodiment and shows a cross section taken along a longitudinal direction of the opening 14s, similarly to FIG. 3.

As shown in FIG. 11, a sputtering device 10B of the third embodiment is different from the sputtering device 10 of the first embodiment in that it includes gas supply units 230 and 240 for supplying a gas to gaps A1 and A2 by the first member 52 and the inner member 141 with a labyrinth structure. The other configurations may be the same as those of the sputtering device 10 of the first embodiment. Hereinafter, differences from the sputtering device 10 of the first embodiment will be mainly described.

The gas supply unit 230 includes a gas channel 232 and a gas inlet flange 233.

The gas channel 232 is formed in the first member 52 by a hole having an L-shaped cross section. The gas channel 232 has one end connected to the gap A1 and the other end connected to the gas inlet flange 233.

The gas inlet flange 233 is attached to the bottom surface of the first member 52 via a seal member 234, and introduces a gas supplied from a gas supply source (not shown) into the gas channel 232. The gas supplied from the gas supply source may be a reactant gas, e.g., $O_2$ gas, $N_2$ gas, or a gaseous mixture of $O_2$ gas and $N_2$ gas.

The gas supply unit 240 is disposed to face the gas supply unit 230 with the opening 14s interposed therebetween. The gas supply unit 240 has a gas channel 242 and a gas inlet flange 243.

The gas channel 242 is formed in the first member 52 by a hole having an L-shaped cross section. The gas channel 242 has one end connected to the gap A2 and the other end connected to the gas inlet flange 243.

The gas inlet flange 243 is attached to the bottom surface of the first member 52 via a seal member 244, and introduces a gas supplied from a gas supply source (not shown) into the gas channel 242. The gas supplied from the gas supply source may be a reactant gas, e.g., $O_2$ gas, $N_2$ gas, and a gaseous mixture of $O_2$ gas and $N_2$ gas.

In the sputtering device 10B including the gas supply units 230 and 240, the gas supplied from the gas supply source is supplied to the gas channels 232 and 242 by the gas inlet flanges 233 and 243, and is injected toward the substrate W from the gaps A1 and A2.

As described above, in accordance with the sputtering device 10B of the third embodiment, the following effects are realized in addition to the effects realized by the sputtering device 10 of the first embodiment.

In accordance with the sputtering device 10B, the gas is injected toward the substrate W from the gaps A1 and A2 close to the substrate W that moves below the opening 14s in the X direction that is one horizontal direction and, thus, the gas can be efficiently supplied to the substrate W.

Further, in accordance with the sputtering device 10B, the gas introduced from the gas supply source into the gas channels 232 and 242 through the gas inlet flanges 233 and 243 is supplied to the substrate W through the gaps A1 and A2 formed at the labyrinth structure and, thus, the flow velocity of the gas can be reduced. Accordingly, the reaction between the substrate W and the gas can be further promoted.

Further, in the sputtering device 10B, the flow velocity of the gas passing through the gaps A1 and A2 can be controlled by increasing or decreasing the width of the labyrinth structure of the gaps A1 and A2 by changing the shape of the inner member 141. Therefore, if multiple types of the inner members 141 are prepared, it is possible to easily supply a gas suitable for the processing conditions simply by exchanging the inner members 141.

Although the example in which the gas is supplied to the labyrinth structure formed by the inner member 141 and the first member 52 has been described in the above embodiment, the present disclosure is not limited thereto. For example, the gas may be supplied to the labyrinth structure formed by the inner member 141 and the outer member 142. Since the labyrinth structure formed by the inner member 141 and the outer member 142 is formed over the entire circumference of the opening 14s, it is possible to supply the gas at a controlled flow velocity toward the opening 14s from the entire circumference of the opening 14s, and also possible to efficiently suppress uneven gas flow.

The above-described embodiments are considered to be illustrative in all aspects and not restrictive. The above-described embodiments may be omitted, replaced, or changed variously without departing from the scope and the gist of the following claims.

In the above embodiment, the case in which the substrate W is moved in the processing chamber 12 by moving the stage 18 by the moving mechanism 20 having the multi joint arm 20c has been described. However, the present disclosure is not limited thereto. For example, the substrate W may be moved in the processing chamber 12 by the transfer device of the transfer module connected to the sputtering device 10.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A sputtering device comprising:
a processing chamber where a substrate is accommodated;
a slit plate that partitions the processing chamber into a first space where a target member is disposed and a second space where the substrate is disposed, the slit plate extending horizontally at a position above the substrate; and
a stage configured to support the substrate in the processing chamber, the stage having at least one convex portion,
wherein the slit plate includes:
an inner member having an opening that penetrates therethrough in a thickness direction of the slit plate; and
an outer member disposed around the inner member,
wherein the inner member is attachable to and detachable from the outer member,
wherein the opening has a rectangular shape having a longer edge greater than a width of the substrate in a direction extending along the longer edge of the opening during film formation and having a shorter edge smaller than a width of the substrate in a direction extending along the shorter edge of the opening during the film formation,
wherein the sputtering device further comprises a wall member disposed in the second space, the wall member supports the inner member at a side of the shorter edge of the opening, and the inner member is fixed to the wall member at a position that does not overlap with the substrate when seen from above, and
wherein the wall member has at least one concave portion and the convex portion of the stage is inserted into the concave portion of the wall member,
wherein the sputtering device further comprises a gas supply unit configured to supply a gas from an inner side of the inner member toward the substrate and the gas supply unit has a gas injection hole formed as a long hole extending along a shorter edge of the opening.

2. The sputtering device of claim 1, wherein the target member is disposed obliquely above the opening.

3. The sputtering device of claim 2, wherein the inner member is fixed to the wall member only at the side of the shorter edge of the opening.

4. The sputtering device of claim 3, wherein the inner member has a tapered portion whose thickness is decreased from an outer periphery thereof toward a center thereof, and a corner of a central side of the tapered portion is rounded.

5. The sputtering device of claim 4, wherein a connection part between the inner member and the outer member has a labyrinth structure.

6. The sputtering device of claim 1, wherein the inner member is fixed to the wall member only at the side of the shorter edge of the opening.

7. The sputtering device of claim 1, wherein the inner member has a tapered portion whose thickness is decreased from an outer periphery thereof toward a center thereof, and a corner of a central side of the tapered portion is rounded.

8. The sputtering device of claim 1, wherein a connection part between the inner member and the outer member has a labyrinth structure.

9. The sputtering device of claim 1, wherein the second space has a first area and a second area, and
wherein the first area includes a space directly below the opening and a space directly below the slit plate and the stage moves in the first area.

10. The sputtering device of claim 9, wherein the wall member extends along a boundary between the first area and the second area and defines the first area.

11. The sputtering device of claim 9, wherein a path around the stage between the opening and the second area is bent by the convex portion formed at the stage to form a labyrinth structure.

12. A sputtering device comprising:
a processing chamber where a substrate is accommodated;
a slit plate that partitions the processing chamber into a first space where a target member is disposed and a second space where the substrate is disposed, the slit plate extending horizontally at a position above the substrate; and
a stage configured to support the substrate in the processing chamber, the stage having at least one convex portion,
wherein the slit plate includes:
an inner member having an opening that penetrates therethrough in a thickness direction of the slit plate; and
an outer member disposed around the inner member,
wherein the inner member is attachable to and detachable from the outer member,
wherein the opening has a rectangular shape having a longer edge greater than a width of the substrate in a direction extending along the longer edge of the opening during film formation and having a shorter edge smaller than a width of the substrate in a direction extending along the shorter edge of the opening during the film formation,
wherein the sputtering device further comprises a wall member disposed in the second space, the wall member supports the inner member at a side of the shorter edge of the opening, and the inner member is fixed to the wall member at a position that does not overlap with the substrate when seen from above, and
wherein the wall member has at least one concave portion and the convex portion of the stage is inserted into the concave portion of the wall member,
wherein the wall member forms a gap of a labyrinth structure with respect to the inner member, and wherein the sputtering device further comprises a gas supply unit configured to supply a gas to the gap.

* * * * *